United States Patent [19]

Elmer et al.

[11] 4,007,446
[45] Feb. 8, 1977

[54] MULTIPHASE SERIES-PARALLEL-SERIES CHARGE-COUPLED DEVICE REGISTERS

[75] Inventors: Ben R. Elmer, Glendale; Wallace E. Tchon; Anthony J. Denboer, both of Phoenix, all of Ariz.

[73] Assignee: Honeywell Information Systems, Inc., Phoenix, Ariz.

[22] Filed: June 30, 1975

[21] Appl. No.: 592,156

[52] U.S. Cl. .................. 340/173 R; 340/173 CA
[51] Int. Cl.² ........................................ G11C 11/40
[58] Field of Search ... 340/173 R, 173 CA, 174 SR, 340/168 SR; 328/37; 307/221 R, 221 C, 224 C, 225 C

[56] References Cited
UNITED STATES PATENTS

| | | | |
|---|---|---|---|
| 3,763,480 | 10/1973 | Weimer | 340/173 R |
| 3,797,002 | 3/1974 | Brown | 340/174 SR |
| 3,913,077 | 10/1975 | Erb | 340/173 R |

*Primary Examiner*—Thomas A. Robinson
*Attorney, Agent, or Firm*—William W. Holloway, Jr.; Nicholas Prasinos; Ronald T. Reiling

[57] ABSTRACT

The invention comprises a charge-coupled device shift register for storing and transferring bits of information in the form of small packets of charge. The apparatus utilizes multiphase clocking to allow for high density storage within the register which is comprised of three sections: serial input section, central storage section and serial output section. The serial input section receives charge packets synchronously from an injector circuit and is driven by two-phase clocking. The central section forms the heart of the storage and transfer mechanism and is driven by multiphase clocking. The serial output section, also driven by two-phase clocking, synchronously emits charge packets which are sensed and amplified by a sense amplifier circuit. The input and output sections each contain the same number of cell sites as the number of bits which are transferred in parallel through the central section. However, these sections store data bits in only every other cell site. Data bits are transferred from the input section to the central section in two phases. Data bits are also transferred from the central section to the output section in two phases. This interleaved mode of inter-sectional data transfer allows for input and output sections of a minimum size (in terms of number of cell sites required) and hence, a greater density CCD register. The interleaved mode also reduces the number of charge transfer from input to output, thereby providing inherent charge transfer efficiency.

24 Claims, 13 Drawing Figures

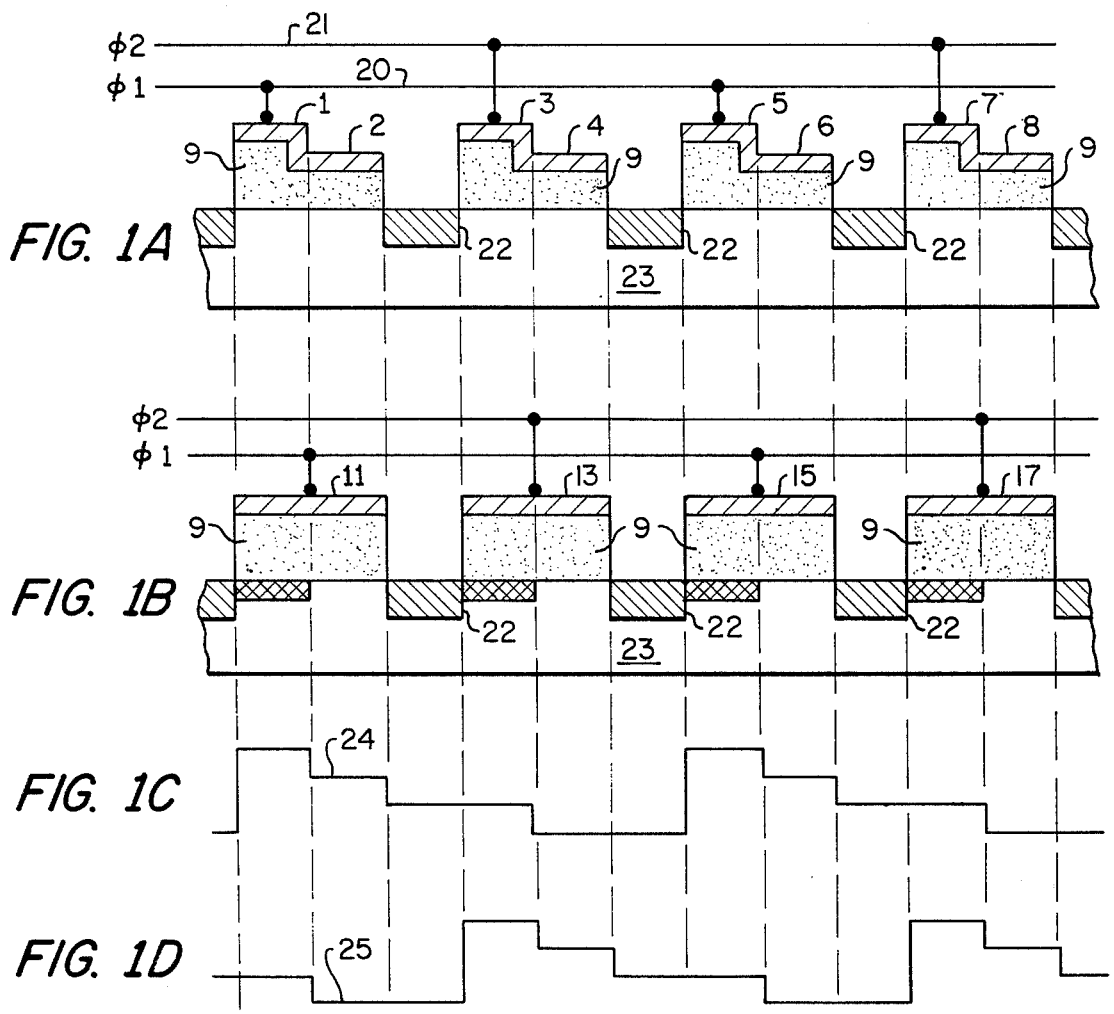
FIG. 1A
FIG. 1B
FIG. 1C
FIG. 1D
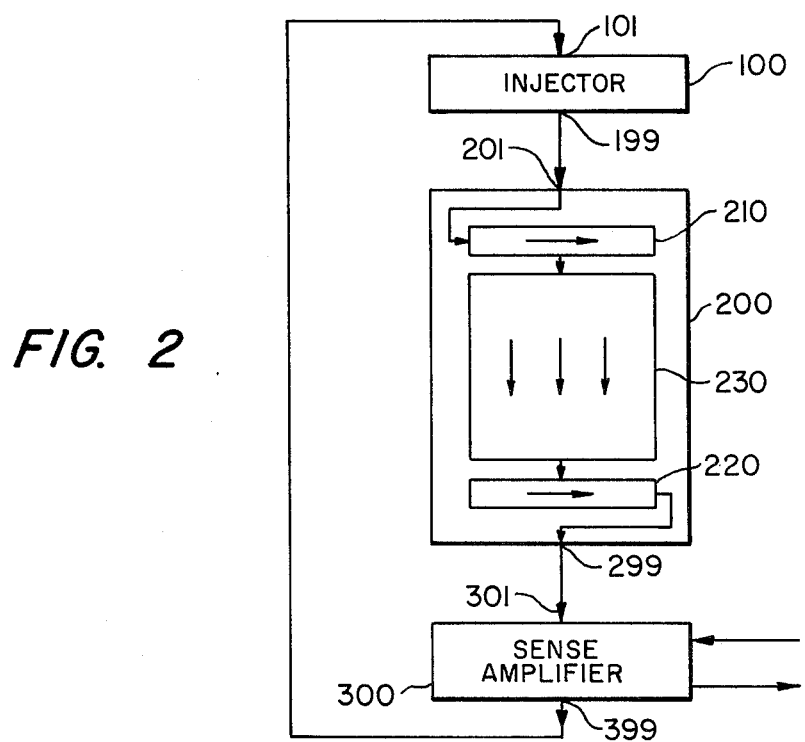
FIG. 2

MULTIPHASE SERIES-PARALLEL-SERIES CHARGE-COUPLED DEVICE REGISTERS

RELATED APPLICATIONS

The following U.S. patent applications, all assigned to the same assignee as named herein, are hereby incorporated by reference into the instant application:

No. 1. "Staggered Oxide Conductivity Connected Charge-Coupled Device" by Wallace E. Tchon, Ser. No. 475,370, filed on June 3, 1974.

No. 2. "Work Function Barrier Charge-Coupled Device" by Wallace E. Tchon, Ser. No. 475,371, filed on June 3, 1974.

No. 3. "Charge Injectors For CCD Registers" by Wallace E. Tchon, 10 Ser. No. 592,147, filed on June 30, 1975.

No. 4. "Charge Detectors For CCD Registers" by Ben R. Elmer and Wallace E. Tchon, Ser. No. 591,667, filed on June 30, 1975.

No. 5. "CCD Register Interface with PARTIAL-WRITE Mode" 15 by Ben R. Elmer and Wallace E. Tchon, Ser. No. 591,723, filed on June 30, 1975.

No. 6. "Chain Selection Scheme In A Fault Tolerant Mode and Circuits For Implementing Same In CCDs" by Ben R. Elmer, Serial No. 592,155, filed on June 30, 1975.

No. 7. "Fault Tolerant CCD Memory Chip" by Ben R. Elmer and Wallace E. Tchon, Serial No. 591,666, filed on June 30, 1975.

No. 8. "Multiphase Series-Parallel-Series Charge-Coupled Device Registers With Simplified Input Clocking" by Ben R. Elmer 25 et al., Ser. No. 591,724, filed on June 30, 1975.

BACKGROUND OF THE INVENTION

1. Field of the Invention

The invention relates generally to configurations for efficient utilization of charge-coupled devices as storage registers, and more particularly to apparatus forming a multiphase series-parallel-series (SPS) charge-coupled device (CCD) shift register.

2. Description of the Prior Art

In data processing technology, memories, devices for storage of information, are of critical importance. A recent development in this technology is that of charge-coupled devices. The basic operation of charge-coupled devices (CCDs) has been explained in detail in the technical and patent literature, but a brief summary of the operation of such devices is believed to facilitate an understanding of the present invention. While the operation of a charge-coupled device will be given in terms of specific semiconductor material types, it will be understood that in general where N-type material is specified, P-type material may be substituted and vice versa. The device can also be implemented using buried channel technology.

A typical charge-coupled device may consist of an N-type silicon substrate (in which holes are normally the minority signal carriers) with a silicon dioxide insulating layer superimposed on its surface. An arrangement of conducting electrodes is deposited on the surface of the insulator.

When clock voltages are applied to predetermined groupings of the electrodes, the holes in the vicinity of each electrode, assuming that holes are initially present (as a result, for example, of the injection into the device), will move one charge-coupled element, or unit cell, in a predetermined direction for each full clock cycle. The packets of charge move in the predetermined direction as a result of the continuous lateral displacement of the local potential well in which they find themselves. Charge-coupling is thus the collective transfer of all the mobile electric charge stored within a semiconductor storage element to a similar, adjacent storage element by the external manipulation of clock voltages.

The quanity of charge capable of being stored in the mobile packets can vary widely, depending on the applied voltages, the capacitance of the storage element, and other factors. The amount of electric charge in each packet can represent information. Charge coupled devices have utility in photosensor arrays, delay lines, shift registers, buffer memeories, sequential-access memories, fast-access scratch-pad memories, refresh memories, and other information storage and transfer mechanisms.

The focus of the present invention is not concerned with the physical structure, i.e., the internal charge transfer and charge storage positions of a charge-coupled device, no with the manufacturing processes for effecting the same. Several types of change storage and charge transfer structures are known in the art. Two such structures are described in "Staggered Oxide Conductivity Connected Charge-Coupled Device" and "Work Function Barrier Charge-Coupled Device", Related Applications Nos. 1 and 2 respectively, and may be utilized in conjunction with the present invention. These inventions permit closed row-to-row spacing and hence, a structure of higher density than some other prior art devices. They also eliminate the necessity of closely spaced electrodes and the attendant problems associated with such design, as well as reduce the power consumption and allow for relatively high operational frequency of charge-coupled devices.

The present invention is concerned with utilization of CCDs as memory devices in computer systems. Such memories are generally of two types: main memories which are characteristically fast and expensive, and auxiliary memories which are relativey slow but cheap. CCD-type memories are envisioned as a third (intermediary) memory, with particular utility as a cache memory, i.e. a buffer unit between main and auxiliary memories. In such applications, CCDs could present considerable advantages if their potential for providing high density storage can be realized. Essential to such realization is the requirement of having the highest density registers possible.

Prior art CCD applications have been generally of a serpentine configuration, which is a back-and-forth serial transfer path. Charge packets are serially transferred in a first direction through a first row. They are then sensed and amplified, and then serially transferred through the second row in the opposite direction. This sequence of operations transfer, sense and amplify, and then transfer in the opposite direction is repeated for a plurality of rows.

Alternate configurations have been suggested in the prior art including parallel and series-parallel-series (SPS) registers. However, none of the suggested configurations were capable of high density storage, which is essential to any arrangement for actual utilization of CCDs in a computer environment. This is due in part to the fact that the prior art configurations were developed primarily for applications in the optical imaging field.

The clocking for the serpentine and most other prior art configurations has been two-or three-phase clocking. In this manner, only two or three clock drivers are required, but the storage density within the CCD is far less than optimal. Two-phase clocking requires two sites (or cells) per bit of information stored, thereby utilizing only 50% of the storage capacity. Three-phase clocking requires three sites per bit. Clearly, improvement upon these storage densities is desirable. Multiphased operation of registers have been proposed in the prior art. However, they have generally been inefficient, some have required a multiplexed rhombus configuration. In the optimum, it is desirable to approach one site per bit of information. Such high density could then be directly reflected in significant cost savings in computer memories systems which utilize CCD technology. An arrangement is also needed whereby high density CCDs are designed for usage in an environment which itself is highly efficient in its spaced requirements.

Another problem with CCD storage devices in general, and the serpentine configuration in particular, is that charge is dissipated as it is transferred from cell to cell. This imposes the requirement that there can be only a limited number of transfers of the charge packets before the introduction of a refresh operation, i.e. an amplification of the charge packet. It is noted that amplifiers do not perform the essential memory function, i.e, storage. Therefore, it is desirable to minimize the number of amplifiers required per bit of storage in order to achieve a high density environment for the register.

OBJECTS OF THE INVENTION

Accordingly, it is a principal object of the present invention to provide an improved charge-coupled device register.

It is also an object of the invention to provide a charge-coupled device register making optimum usage of space.

It is another object of the invention to provide a charge-coupled device register which consumes relatively less power than prior art devices.

It is another object of the present invention to provide a system for multiplexing of electrode per bit data through a serial register, as opposed to the conventional rhombus type multiplexing, using conventional MOS circuit multiplexers.

It is still another object of the invention to provide an improved charge-coupled device register that is relatively simple and inexpensive to manufacture, and which may be made and driven by circuits utilizing commonly known MOSFET semiconductor manufacturing techniques.

It is a further object of the present invention to provide an SPS register with a relatively high number of respective storage sites per amplifier.

Yet another object of the invention is to provide an improved SPS charge-coupled device register which is driven by multiphase clock drivers.

Other objects and advantages of the present invention will become more apparent to one skilled in the art when read in conjunction with the drawings contained herewith.

SUMMARY OF THE INVENTION

The present invention provides a CCD register comprised of four basic components: input section, central section, output section, and a plurality of clock drivers. Data is stored and transferred in the form of small packets of charge.

The input section is a serial shift register, driven by modified two-phase push clock operation. It provides a buffer for serially receiving an input stream of data in a synchronous manner, i.e. without halting the flow of data. The length of the input section number of storage sites is equal to the width of the central section. The input section aligns the packets of charge for parallel transfer into the central section in two phases.

The output section is also a serial shift register and is driven by two-phase push-clock operation. It provides a buffer for serially transmitting an output stream of data in a synchronous manner. The length of the output section is also equal to the width of the central section. The output section is aligned with the central section for parallel transfer of charge packets from the latter in two phases.

The central section is the main storage area of the register. It provides a pluralitiy of serial shift registers which are aligned in parallel (comprising the width of the parallel section). In this manner, charge packets are received into, shifted through the length of and transmitted from the central section in parallel. The central section is coupled to the input and output sections by gating means which, in combination with certain of the clock drivers, buffer the flow the charge packets into and out of the central section. The central section is driven by a plurality of multiphase clock drivers.

The clock drivers provide two-phase, modifed two-phase, and multiphase drive signals to the register. The sum of the multiphase signals equal the two-phase signals. The modified two-phase signals are the two-phase signals with certain pulses omitted. In this manner, all of clock drive signals are obtained from three basic clock drivers, modified by appropriate circuitry.

BRIEF DESCRIPTION Of THE DRAWINGS

The invention will be described with reference to the accompanying drawings wherein:

FIG. 1A is a schematic diagram showing a cross-section portion of a staggered oxide conductivity connected charge-coupled device;

FIG. 1B is a schematic diagram showing a cross-section of an alternate embodiment of a CCD;

FIGS. 1C and 1D are representations of potential profiles for the devices of FIGS. 1A and 1B;

FIG. 2 is a block diagram of an electrode-per-bit CCD storage system;

DETAILED DESCRIPTION OF THE PREFERRED EMBODIMENT

Figure 3:
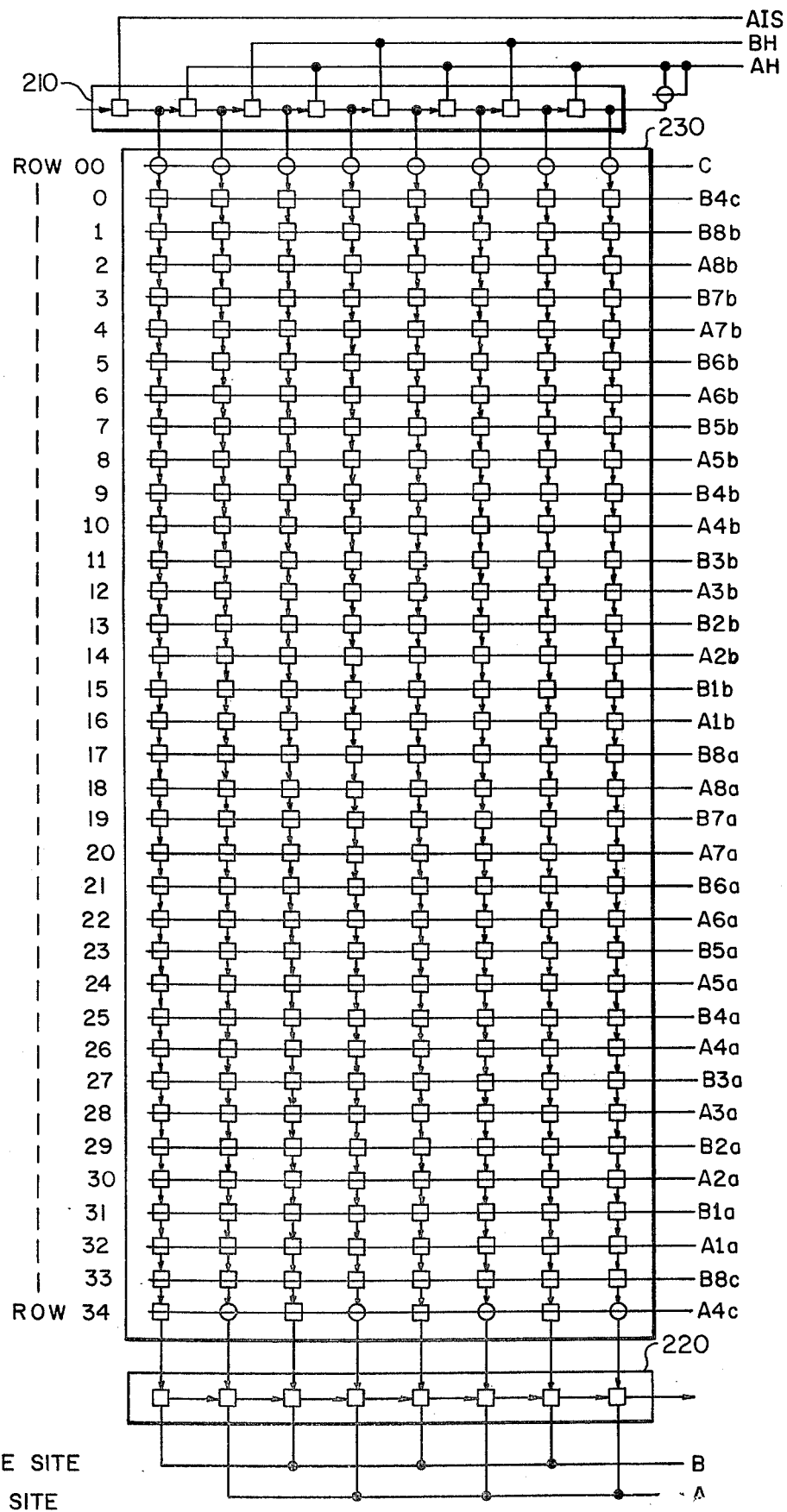
FIG. 3 is a diagram of an SPS register illustrating a preferred embodiment of the invention.

Before describing in detail the configuration for series-parallel-series (SPS)charge-coupled device (CCD) shift registers, it is desirable to describe in additional detail, the structure and operation of a conductivity-connected charge-coupled device.

Referring now to FIG. 1A, there is shown a cross-sectional schematic diagram of a portion of a staggered oxide, conductivity connected charge-coupled device, comprising a substrate 23 of N-type semiconductor material, staggered oxide layers 9 overlying the substrate 23, and various electrode pairs, 1-2, 3-4, 5-6, and 7-8, each pair being associated with and overlying a respective staggered oxide layer 9. The two electrodes of each electrode pair are electricaly connected, either through the physical continuity of the electrode pair, or at the edge of the semiconductor device (not shown) in the event that the members of the electrode pair become separted during the course of the manufacturing process. The staggered oxide layer 9 is formed of an insulating material such as silicon dioxide ($SiO_2$). The composition of the electrodes may be metal, such as aluminum or gold, or it may be a polysilicon (polycrystalline silicon which has been diffused with impurity atoms).

As seen in FIG. 1A, alternate pairs 1-2, 5-6, etc. of electrodes are connected to a first voltage phase line 20, whereas the remaining electrode pairs 3-4, 7-8, etc. are connected to a second voltage phase line 21. This arrangement is utilized for two-phase push-clock operation of the charge-coupled device (which is utilized in the input and output series section of the preferred embodiment), but it is understood that the device may be operated in other clocking modes, such as multi-phase, (which is the case in the central section of the preferred embodiment). By alternately applying different voltages to lines 20 and 21, packets of charge representing information may be caused to move from left to right in the FIG. 1A representation, in a manner which is known to the art.

In the substrate areas underlying the gaps between adjoining electrode pairs are P++ diffusion regions 22. These regions may be formed by diffusing boron atoms, for example, into the N-type silicon substrate in standard doping densities, (e.g., $10^{18}$ to $10^{20}$ atoms per cubic centimeter). The diffusion regions 22 function essentially as conductive wires, in the sense that as one unit of charge enters a diffusion region from one side, another unit of charge leaves the diffusion region from the other side. The physical operation of these diffusion regions is therefore to be distinguished from the manner in which charge is transported through the substrate, in that the charge itself is transported through the substrate in the latter case.

The use of wire-like conductivity connecting regions 22 permits easy tapping into the charge-coupled device, as, for example, for the purpose of reading data non-destructively. Furthermore, it offers the advantage that as charge enters the region, charge also exits the region substantially simultaneously from the other end. Such operation is distinguishable from that of charge-coupled devices which lack diffusion regions, but have unsealed channeld in the form of gaps between conductors. The present device is more tolerant to the presence of contaminants on the oxide surface which cause surface barrier instability.

Referring now to FIG. 1B, an alternate (to the staggered oxide) form of CCD is shown. This embodiment is functionally equivalent to the staggered oxide embodiment of FIG. 1A, but is formed by different processes. Specifically, instead of forming a unidirectional barrier adjacent cells by virtue of thick oxide regions, this embodiment provides for a uniform oxide layer 9, but has an N+ region (shown as cross-hatched) in the forward portion of the cell site. The N+ region may be provided by an ion implantation process. Accordingly, in the description below with respect to FIGS. 1C and 1D, reference to electrode pairs 1-2, 3-4, 5-6, etc. of FIG. 1A is equivalent to reference to electrodes 11, 13, 15 etc. of FIG. 1B respectively.

Referring now to FIGS. 1C and 1D, potentional profiles 24 and 25 respectively are shown for the conditions when the $\phi 2$ line 21 is more negative than the $\phi 1$ line 20 (FIG. 1C) and when $\phi 1$ line 20 is more negative than the $\phi 2$ line 21 (FIG. 1D). The potential profiles 24 and 25 are shown corresponding to regions under substrate 23, and do not represent the actual physical dimensions of such a profile relative to the device dimensions. (In this regard, the relative dimensions of any of the elements in the drawing are not to be considered accurate, as they have been distorted for ease in understanding the invention. Further information regarding physical dimensions for such devices is given in Related Applications Nos. 1 and 2. Typical dimensions for the embodiment shown in FIG. 1A are as follows: substrate = 5 to 10 mils thin oxide = 1000 Angstorms (A) barrier oxide = 3000 A polysilicon = 3000 A P++ region = 7500 A The potential profiles 24 and 25 represent the depth of the potential wells formed below the corresponding electrodes and diffusion regions. For example, with respect to FIG. 1C, the more negative voltage applied to electrode pair 3-4 causes relatively deeper potential wells below electrodes 3-4 than below electrodes 1-2 and 5-6. (The converse is true with respect to FIG. 1D). The applied negative voltage serves to repel majority carriers (electrons in the case of N-type substrate) from the surface of the substrate directly below the electrodes. The depth of the potential wells formed at the surface of the substrate depends first upon the relative magnitudes of the voltages applied to the electrode pairs, and second upon the thickness of the silicon dioxide layer between the individual members of the electrode pairs and the substrate. The thinner the layer of silicon dioxide beneath an electrode, the deeper is the potential well for a given voltage amplitude applied to that electrode. Accordingly, the potential well below electrode 4 is deeper than that below electrode 3.

The region of the substrate 23 corresponding to the P++ diffusion regions 22 is at a potential level substantially identical to that of the lower of the two adjoining potential levels. For example, the P++ diffusion regions 22 situated between electrode pairs 1-2 and 3-4 has a potential level substantially equal to that below electrode 3 in FIG. 1C. On the other hand, the potential level of this P++ diffusion region of the substrate 23 is at a potential level substantially identical to that of the substrate region immediately below electrode 2 in FIG.

1D. The manner by which the successive application of different voltage potentials to the electrode pairs results in the incremental shifting of charge through the device will be discussed in further detail below.

Referring now to FIG. 2, a block diagram of a bit per electrode CCD register storage system is shown. All of the components in the CCD register storage system are integrated within a single semiconductor chip which may contain a plurality of such register systems. (For additional details, see Related Application No. 7). It is noted that a single line connected various blocks within FIG. 2 may represent a plurality of connecting leads. Also, the unconnected arrowheads in FIG. 2 represent the direction of flow of information bits. The basic element of FIG. 2 is Block 200 which represents a SPS register. SPS register 200 is comprised of three units: input serial register 210, output serial register 220 and central storage register 230. The input terminal 201 of register 200 is effectively the input terminal to input serial register 210. Bits of information in the form of charge packets are injected into input section 210 and are serially propagated through section 210. Each of the CCD sites (or cells) comprising section 210 is also connected to central section 230. Section 210 is coupled to section 230 via a row of gates which allow parallel transfer of information into central section 230. Information bits are then propagated through the lengthwise section of central section 230. In the preferred embodiment, central section 230 is eight bits wide by 32 effective bits long, thereby providing a 256-bit shift register. The arrows inside of section 230 represent the parallel propagation of information through section 230. At the other (output) end of section 230, the information bits in the form of charge packets are transferred through another gating arrangement into output serial section 220. Upon receiving the information bits, output section 220 transfers the bits serially to the output section output terminal, which is effectively the output terminal 299 of SPS register 200.

SPS register 200 receives, transfers, and transmits information in the form of small packets of charge, in the order of 50 to 230 × $10^{15}$-Coulombs. Clearly, these changes are not of a level equivalent to logic signals at a system level. Accordingly, the register must be buffered in order to handle and transmit appropriate input and output signals.

The packets of charge emitted from SPS register 200 must be sensed and amplified, i.e. refreshed, before further propagation. Additionally, they must be converted to appropriate logic levels before they can be bused to other system components. This is accomplished by sense amplifier 300 which has its input terminal 301 coupled to the output terminal 299 of SPS register 200. Amplifier 300 must be highly sensitive to be able to sense the very small packets of charge after they have been transferred through and decayed within the shift register 200. (For a detailed description of an amplifier which can serve as amplifier 300, see Related Application No. 4). It is also desirable to periodically perform a conventional refresh of the information bits stored in the register 200. This is performed by simply serially shifting the packets of charge from the register to the amplifier, and reinjecting them after they have been amplified. This operation is identical to a read operation with the exception that the latter also entails busing the information, at a logic level, to other system components. Such output busing is done over output line OUT shown in FIG. 2.

Input busing may be done via line IN to amplifier 300. Accordingly, in this embodiment, amplifier 300 is considered to include interface circuitry responsive to control signals for directing the flow of information through the system to perform REFRESH, READ and WRITE operations. (For detailed description of such interface circuitry which may be used with sense amplifier 300, see Related Application No. 5).

An output terminal 399 of amplifier 300 is also connected to the input terminal 101 of injector circuit 100, thereby forming an input path to register 200. Injector 100 acts to convert the system system level signals into appropriate charge packets. These charge packtes are then transferred from the output terminal 199 of injector circuit 100 to the input terminal 201 of register 200. (For detailed description of injector 100, see Related Application No. 3).

Referring now to FIG. 3, multiphase SPS register 200 is shown in detail. In FIG. 3, squares are representative of storage sites and circles are representative of gating sites. Both types of regions are integrated within the semiconductor chip which includes the CCD memory system. Typically, sites are from ¼ to ½ mil square in size. Storage sites are generally filled to only about 75% of their capacity (when storing a 1 bit representation) in the preferred embodiment and allow for only a unidirectional flow of charge. However, the storage sites of input section 210 are provided with two (or branched) output paths (allowing for either serial propagation through input section 210 or parallel transfer to central section 230) and the cells of output section 220 are provided with the two (or branched) input paths (allowing for either parallel input from central section 230 or for serial propagation through output section 220)). The unidirectionality may be obtained by ion implantation (for example phosphorus) or by staggered oxide layers as described in Related Application No. 1 or by other means. The gating regions may be obtained by fully implanting the regions below the electrodes, whereby a region is not capable of storing charge but acts as a barrier responsive to voltage levels applied to its electrode for gating the flow of charge. In other words, fully implanted regions act as MOS transistors which have threshold levels of about 6 volts (as opposed to non-implanted transistors which have threshold levels of about 2 volts).

In the preferred embodiment, SPS register 200 is 8 bits wide, i.e. 8 bits are transferred in parallel through the length of central section 230. Embodiments of alternative widths are clearly possible within the scope and sprit of this invention. Input and output serial sections 210 and 220 are also 8 bits wide and are operated in an interleaved mode. A synchronous and continuous continuous data stream is possible both to input section 210 and from output section 220.

Input serial section 210 is a two-phase CCD shift register and contains 8 storage sites represented by the squares. (The sites in FIG. 3 will be at times referred to as sites 1 to 8 from left to right respectively). These storage sites are identical except for the first site which is larger so as to be able to receive charge from two distinct sources. However, it is not necessary for the first site to be capable of storing more charge. (This is explained in Related Application No. 3.) The 8 sites are coupled serially and internally on the substrate. Consequently, the coupling between the cells, shown in FIG. 3 as unidirectional arrows, is distinct from the coupling of and to the electrodes. The electrodes are formed on the semiconductor chip above each of the sites. (The electrodes are shown in FIG. 3 as passing through the center of each site). They carry the drive or clock signals. The electrode above (to) the first site of storage input serial register 210 is connected to driver AIS. The electrodes to the second, forth, sixth and eighth sites are connected to driver AH and the electrodes to the third, fifth and seventh sites are connected to driver BH. These phase drivers are shown in FIG. 3 adjacent to the rows to which they are applied and are discussed in additional detail below. The last (8th) site of input section 210 is coupled via a different line to an annihilator circuit. This is necessary to avoid an undesired and uncontrolled build-up of residual charge in input section 210. In the preferred embodiment, the annihilator is comprised of a fully-implanted site which has its gate coupled so as to act as a diode-coupled transistor coupled between the 8th site and the phase AH line.

The central section 230 of SPS register 200 is an effective 8 by 32 (256) bit storage register. It contains, however, two additional rows of storage sites required for achieving an optimal working density (which approaches one information bit per storage site). Also, control regions (rows 00 and 34) are considered part of central section 230. It will be obvious to those skilled in the art that these control regions may be considered as separate sections of SPS register 200 or as parts of input serial register 210 and output serial section 220 respectively. Such classification is not essential to an understanding of the invention. Accordingly, the first row (row 00) of central section 230 contains eight fully-implanted sites which do not store charge, but merely act as gates responsive to the drive signals applied to their electrodes. As can be seen in FIG. 3, the electrodes of all of the sites in row 00 are commonly connected to driver C. The next 34 rows (rows 0 to 33) of central section 230 form 8 parallel columns of serially-connected storage sites. These columns may be considered as 8 serial shift registers in parallel, each containing 34 cell sites. However, they function quite differently than a conventional two-phase CCD shift register, as will be explained below. Each row has a driver associated with it which is commonly connected to the electrodes of all of the sites in that row. As shown in FIG. 3, drivers B4c and B8c are coupled to rows 0 and 33 respectively; drivers A1a, A2a, . . . A8a drive rows 32, 30, . . . 18 respectively; drivers B1a to B8a drive rows 31, 29, . . . 17 respectively; drivers A1b to B8b drive rows 16, 14, . . . 2 respectively; and drivers B1b to B8b drive rows 15, 13, . . . 1 respectively. The last row (row 34) of central section 230 has unidirectional storage cells in its first, third, fifth and seventh sites. The second, fourth, sixth and eighth sites are gates (fully implanted sites). Accordingly, the first, third, fifth and seventh sites can store charge, whereas the second, fourth, sixth and eighth merely transfer charge when enabled. The electrodes of all of the sites of row 34 are commonly connected to drive A4c. The outputs of each site of row 34 are connected to respective site positions in output serial section 220. Output serial section 220 contains eight serially-connected storage sites. The electrodes of sites one, three, five and seven are connected to driver B and the electrodes of sites two, four, six and eight are connected to driver A, as also shown in FIG. 3.

Figure 4:
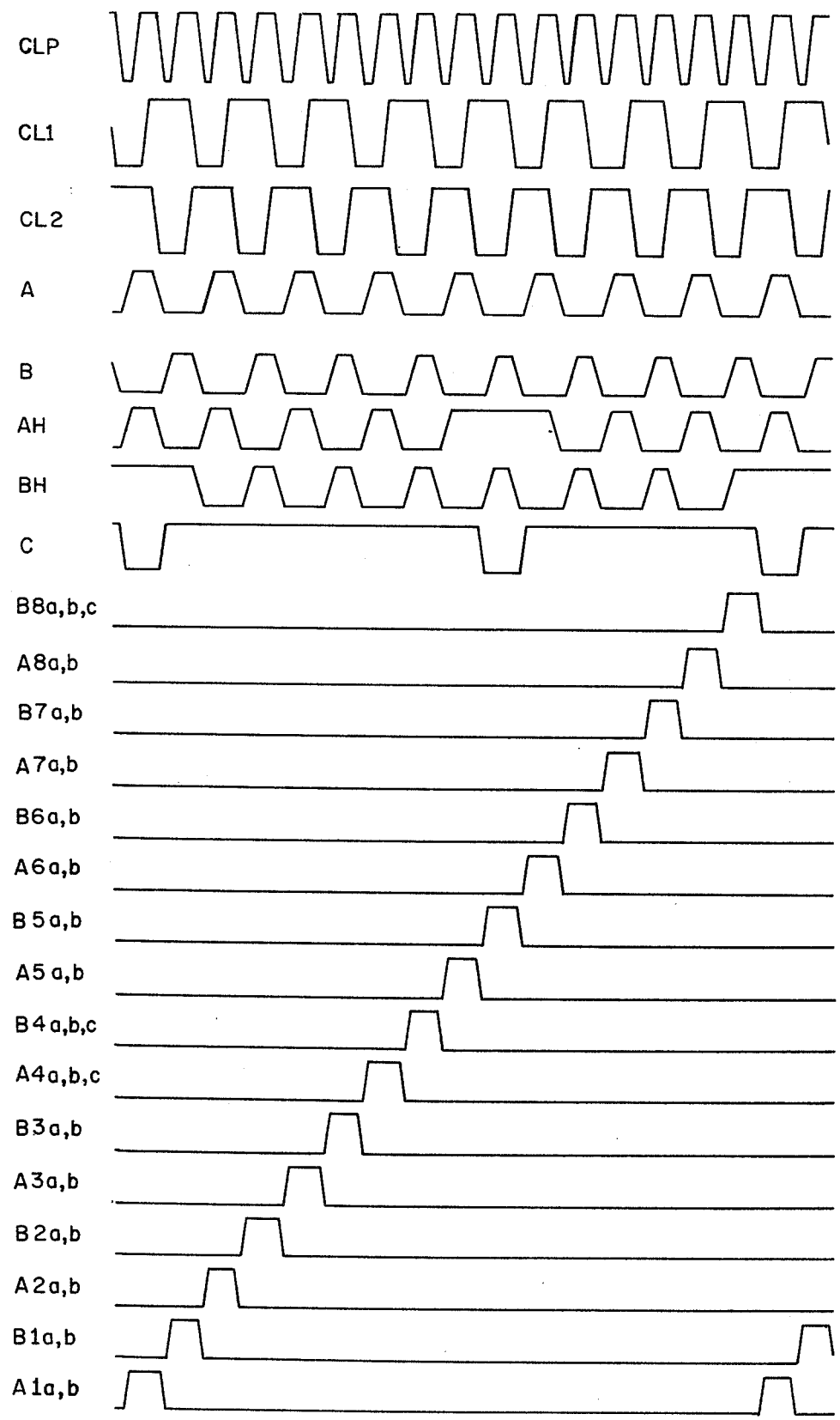
FIG. 4 is a timing diagram showing the relationships between the clock signals for driving the SPS register according to the preferred embodiment of the invention.

Referring now to FIG. 4, the phase relationship and relative amplitudes of the various clocks and drivers for SPS register 200 are shown. Clocks CLP, CL1 and CL2 are system clocks whose signals are bused to arrays comprised of a plurality of registers according to the invention. CLP is a 2 MHZ clock, whereas CL1 and CL2 are complementary 1 MHZ clocks. The other waveforms shown in FIG. 4 are generated by circuitry shown infra, and are generally referred to as phase drivers. Phase A and phase AIS are the same except for their voltage levels. Phase AIS is of slightly higher voltage (about 2 volts) due to the interface requirements of the injector circuit 100. Similarly, phases AH and BH are identical to phases A and B respectively except for the slight modifications shown. In another embodiment, $\phi A$ and $\phi B$ could be $\phi AH$ and $\phi BH$. It is further noted that phase A and phase B are related so as to provide a two-phase driver for serial registers 210 and 230, i.e. phase A and phase B are 180° out of phase with respect to each other. Phases A1 and A8 are on except for a short off pulse; the sum of these pulses equals phase A. Phases B1 to B2 have the same properties (with respect to phase B). Phase C is a short enabling pulse related to phases AH and BH. One final note is that in the preferred embodiment, the CCDs are P-channel devices. Accordingly, an on-pulse is a relatively negative voltage level and an off pulse is a relatively positive voltage level.

Figure 5:
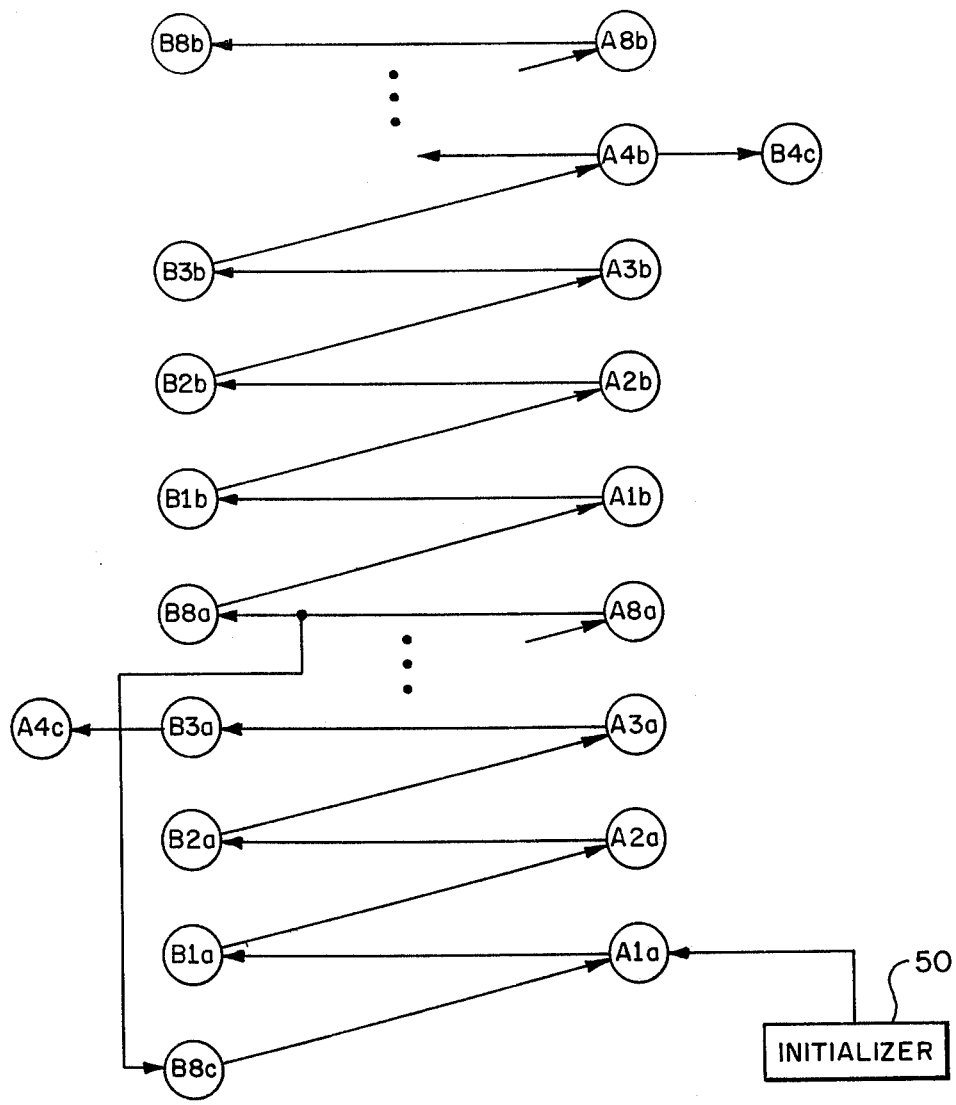
FIG. 5 is a schematic diagram showing the serial relationship between the clock driver circuits for multiphase driving of the SPS register.

Referring now to FIG. 5, the phase relationships of the multiphase drivers for central section 230 are shown. Each circle of FIG. 5 represents the circuit for generating the labeled drive pulse. The lines connecting the circles represent the actual electrodes (polysilicon lines) connecting the drivers and the direction of the arrowhead indicates both the responsiveness of the drivers and the actual direction of the flow of signals between driver circuits. It is noted that all of the A-related drivers are in a column on one side, whereas all of the B-related drivers are on the opposite side. (Phase drivers B4c and A4c are also aligned in this manner.) This conforms to the preferred alignment of these drivers on a chip where SPS registers are combined in a manner to form an array. It is noted that one set of drivers is required for each array, and an array contains a plurality of SPS registers. FIG. 5 shows the phase relationship of the multiphase drivers equivalent to a logical 1 propagating through a shift register. This is analogous to an empty (extra) row propagating in a reverse direction (upwards) through central section 230. An initializer circuit 50 is required when power is first turned on in the system (which may be throught of as generating the initial 1 which propagates through shift registers). A feedback loop is formed by the path from driver $D_{B8c}$ back to the first driver $D_{A1a}$.

For the remaining circuit diagrams, implementation is envisioned as large-scale integrated (LSI) circuits. The circuit elements including metal oxide semiconductor (MOS) transistors, are formed within the same semiconductor chip as the SPS CCD register. Accordingly, P-channel transistors are utilized, consistent with the characteristics of the CCD N-type substrate. For a more detailed description of the MOS transistors shown in circuits 6 through 10, refer to U.S. Pat. No. 3,755,689, issued Aug. 28, 1973, entitled "Two-Phase Three Clock MOS Logic Circuits" by Elmer et al.

Figure 6:
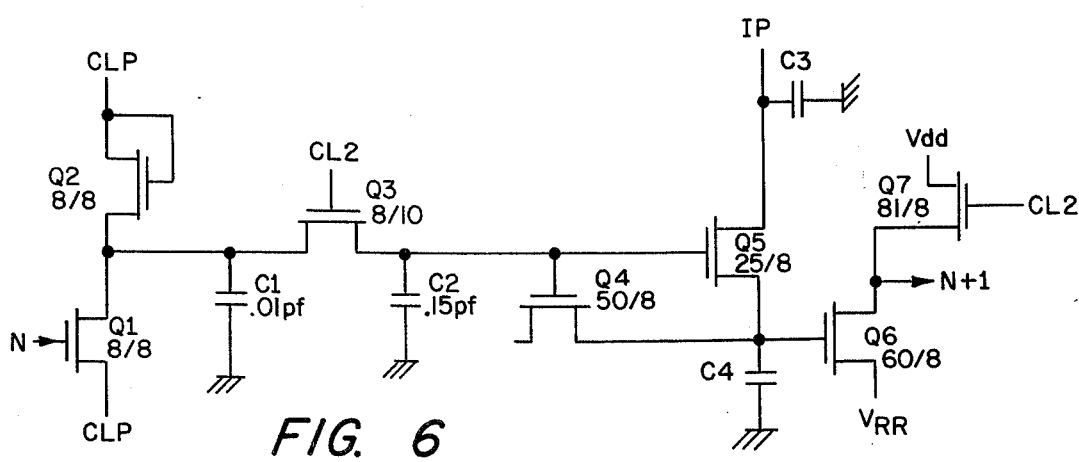
FIG. 6 is a circuit diagram showing the basic circuit for the multiphase drivers for the central section of the SPS register.

Referring now to FIG. 6, a circuit for one of the phase drivers represented in FIG. 5 is illustrated. It should be noted that there are 35 multiphase drive signals and hence 35 driver circuits required for a register, that is, a different phase driver circuit for each of A1a to A8a, B1a to B8a, A1b to A8b, B1b to B8b and B8c, B4c and A4c is required. The phase $D_N$ represents the input signal to the circuit which generates phase $D_{N+1}$ as the output signal. The relationship between the various phases were shown in FIG. 5. The capacitors are shown connected to the substrate. In fact, these capacitances may be inherent in the circuit. Nonetheless, the substrate is at a voltage level sometimes referred to as $V_{BB}$, +14 volts. The circuits for each of the phase A related drives are identical (and as shown in FIG. 6) with the exception of the differing input lines for each different phase. The circuits for the B related drives have the following additional changes from FIG. 6: a signal from clock CL2 should be replaced by a signal from clock CL1; input phase 1P should be replaced by input phase 2P. The only other exception to the generalized circuit shown in FIG. 6 is for the driver circuit for phase A1a. When first turning on the power for the system, this drive circuit must get a signal from the initializer circuit 50 instead of from phase B8c. Hence, the input line to the circuit for phase A1a is connected both to the output of phase B8c and to the output of the initializer circuit 50.

In general in the remaining figures, the circuits shown are for phase A related drives. The only differences between A and B related drives is the transposition from clock CL1 to clock CL2 (or from clock CL2 to clock CL1), and from phase 1P to phase 2P (or from phase 2P to phase 1P).

Figure 7:
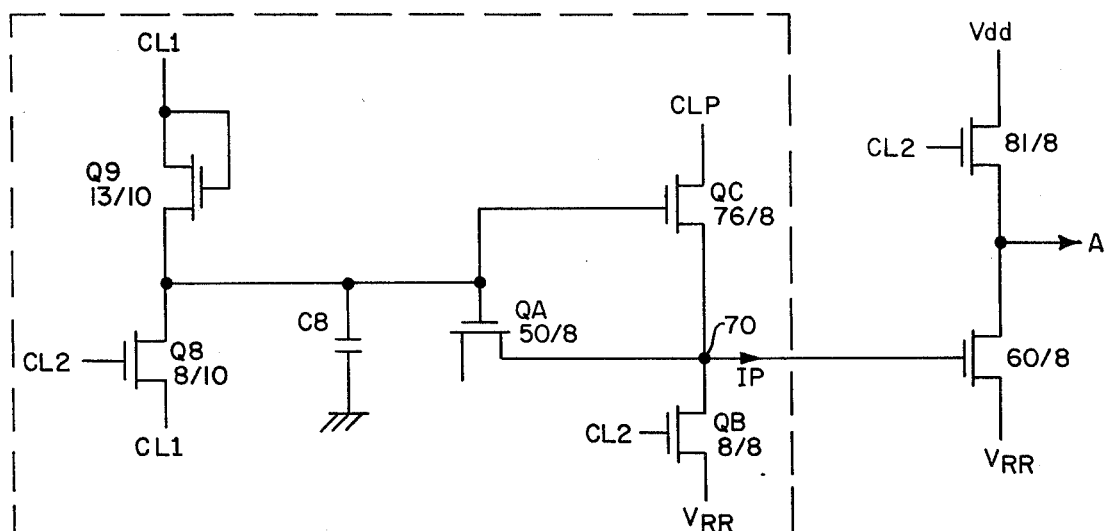
FIG. 7 is a circuit diagram showing the circuit for the two-phase clock signals for driving the output section of the SPS register.

Referring now to FIG. 7, a circuit is shown for one of the basic two-phase drivers required by SPS register 200. The circuit shown is for the driver of phase A. (The driver for phase B is identical with the exception of the transposition discussed above.) The part of the circuit shown within the dotted lines is a basic circuit for all phase A related drivers. The output of this part of the circuit is called phase 1P, which is present at point 70. As can be seen from the other remaining FIGURES, point 70 connects phase 1P to the other circuits.

Figure 8:
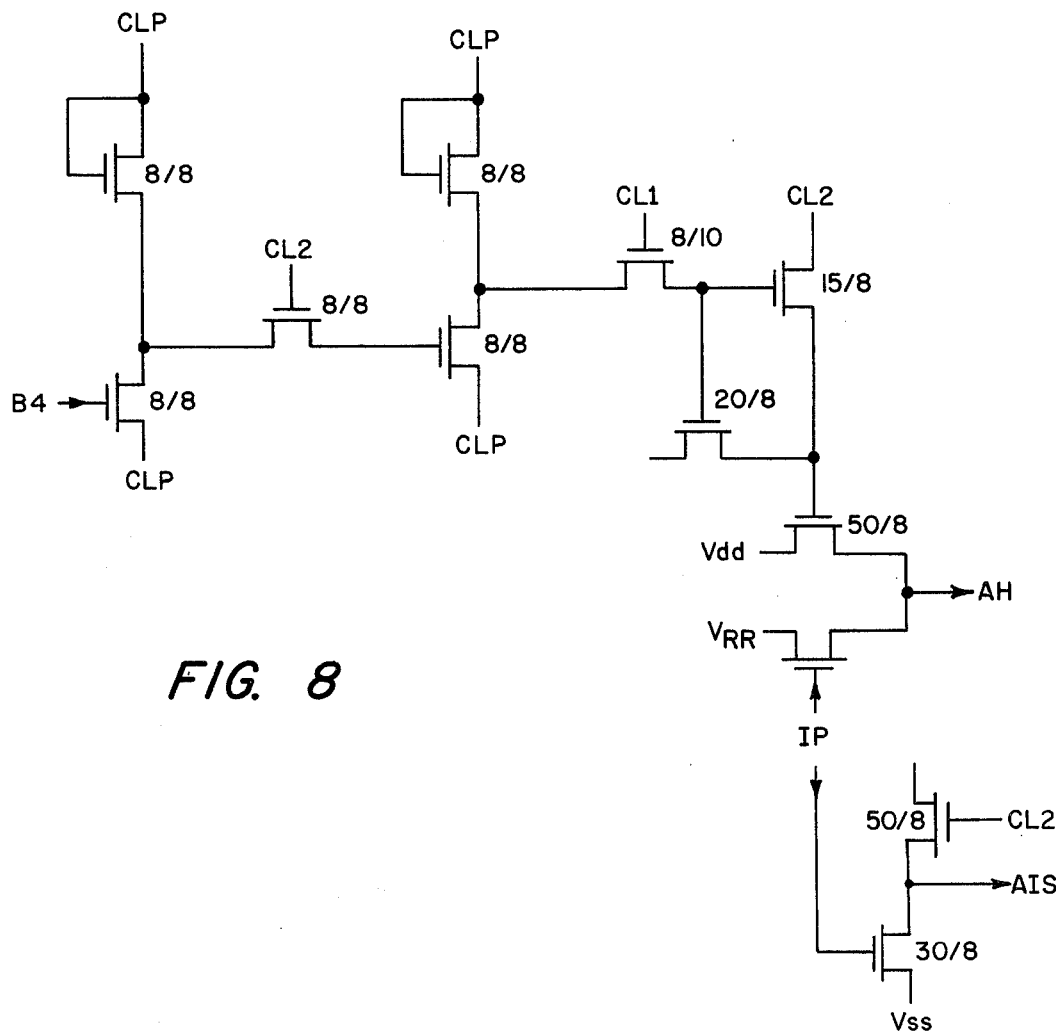
FIG. 8 is a circuit diagram showing the circuits for providing modified two-phase clock signals for driving the input section of the SPS register.

Referring now to FIG. 8, the circuits for obtaining phases AH and AIS are shown. The circuit for phase BH is identical except (1) for the transpositions discussed above and (2) that the input signal would come from the driver for phase A8 instead of the driver for phase B4. (From review of the timing diagrams shown in FIG. 4, this latter modification is evident.) As previously mentioned, the only difference between phase A and AIS is that phase AIS has a larger amplitude due to its connection to $V_{SS}$ which is 12 volts (as opposed to $V_{RR}$ which is 10 volts).

Figure 9:
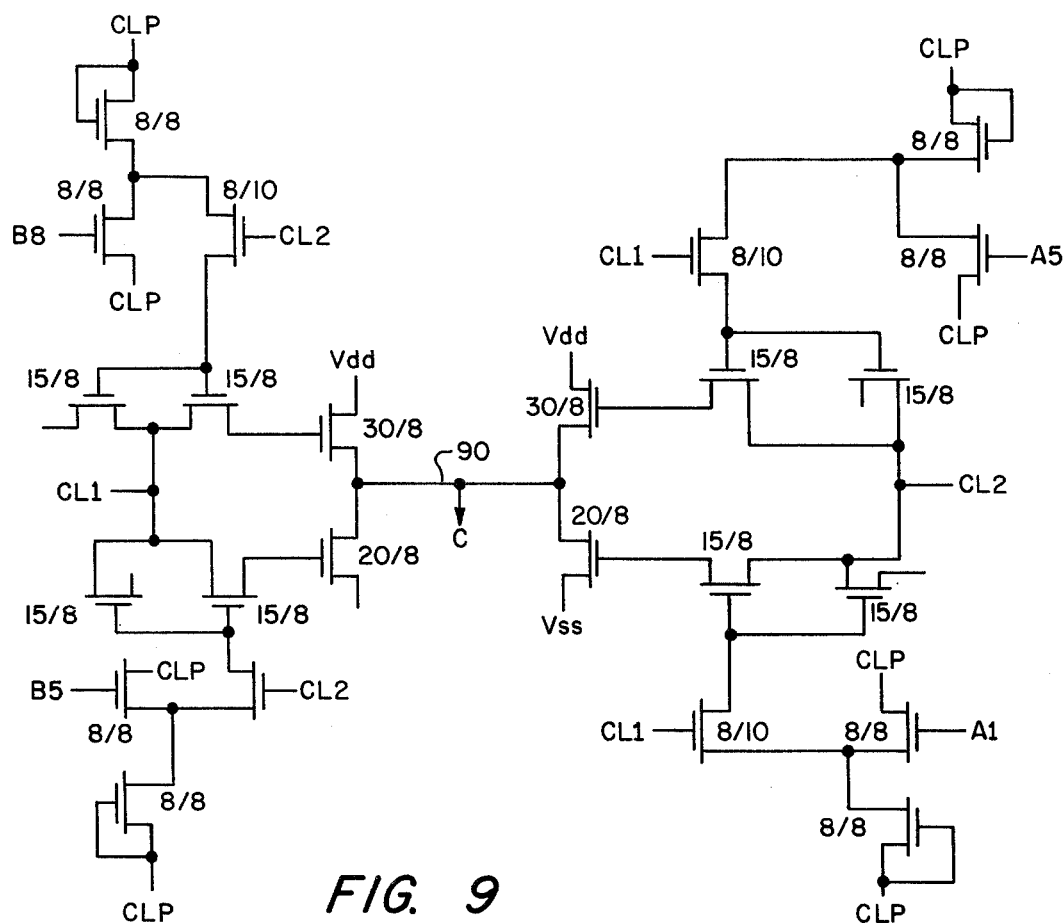
FIG. 9 is a circuit diagram showing the circuit for providing the clock signals for driving the input control gates of the central section of the SPS register.

Referring now to FIG. 9, the circuit for producing phase C is shown. The phase C signal has two components, one A-related and the other B-related. Consequently, line 90 which corresponds to the commonly connected electrodes of row 00, is coupled to an A-related circuit (on one side of the array) and a B-related circuit (on the other side of the array).

Figure 10:
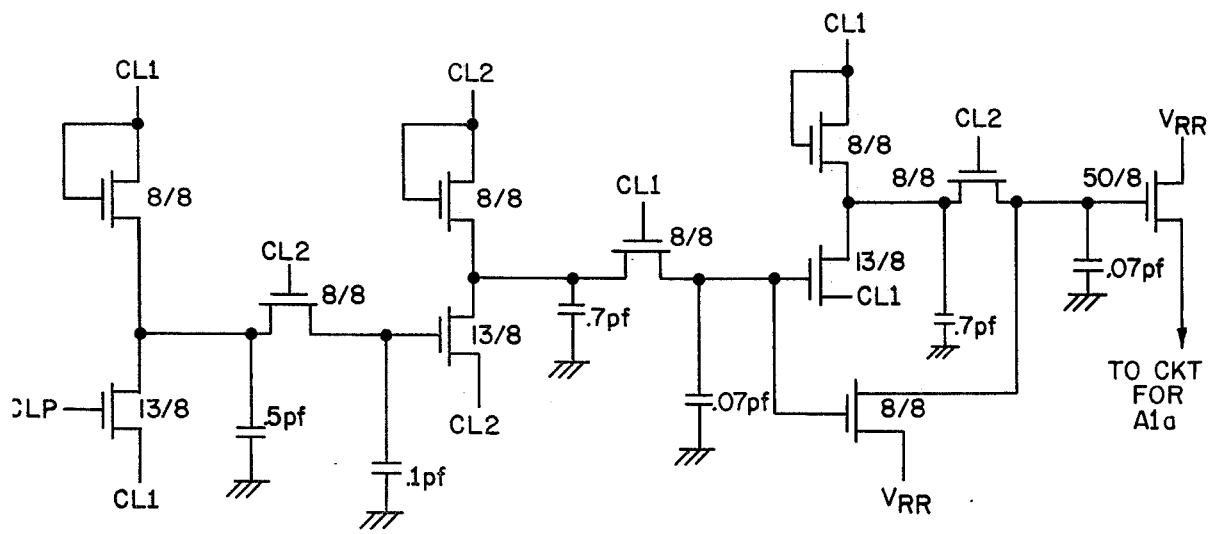
FIG. 10 is a circuit diagram showing the initializer circuit for the clock driver shown in FIG. 5.

Referring now to FIG. 10, the initializer circuit 50 is shown. The output of this circuit is connected as an input to the driver circuit for producing phase A1a. The multiphase timing of the initializer circuit for phase A1a would normally be generated by phase B8c. However, since phase B8c would nor occur when the system is off, i.e. prior to initalization, this circuit generates the initial phase driver loop pulse.

DESCRIPTION OF THE OPERATION OF THE PREFERRED EMBODIMENT

The following description of the operation of the SPS register 200 can be best understood when read in conjunction with FIGS. 2, 3 and 4. With respect to input serial register 210, if the electrodes of cell sites 1, 3, 5 and 7 were connected to phase A and electrodes of sites 2, 4, 6 and 8 were connected to phase B, simple two-phase push clock operation of input section 210 would result. In other words, information bits would be continually received at the input of the first storage site and continually transferred serially through the register. However, it is emphasized that the purpose of input serial register 210 is to act as a input buffer for the central section 230, i.e. to receive the information bits and to align them for parallel transfer into the high-density central section 230. Accordingly, the straight-forward two-phase push clock operation is modified. The altering of the voltage level of phase AIS, which is applied only to the electrode of the first cell of input section 210, is due entirely to requirements for interfacing with the injector 100. Consequently, for purposes of understanding the input of information into input register 210, this modification has no effect. Having effect however is the fact that the maximum density of a two-phase shift register is one bit per two sites, i.e. an information bit can be transferred into input section 210 at most on every other pulse. After receiving a data bit, the bit must be transferred before an additional data bit can be received. Drivers AH and BH, the basic drivers for input section 210, are clocks A and B modified so that the electrodes connected to these clocks are not enabled at every possible cycle, but one potential enabling signal or pulse out of every 8 possible enabling signals is omitted. The consequence of this limited pulsing of input section 210 is as follows. The timing relationships given in FIG. 4 are such that after four bits of data are aligned in input register 210 (for example in positions 1, 3, 5 and 7), it is desired to transfer these bits into central section 230. Accordingly, phase C enables the row 00 of parallel section 230 thereby providing a path for transfer of the information bits into row 0. Simultaneously, phase BH omits a signal which would enable transfer of charge into positions 2, 4, 6 and 8. In other words, the normal serial flow path is shut off and the special parallel flow path is enabled.

Serial input register 210 acts synchronously. By this it is meant that cell site 1 continues to receive data bits even when the information bits are transferred in parallel into the parallel section (since driver AIS does not omit any pulses). Accordingly, on the next cycle, data bits are aligned in positions 1, 3, 5 and 7 again. However, this time it is desired to continue to transfer these data bits into positions 2, 4, 6 and 8. In this manner, the data to be transferred are aligned in the cell sites which previously did not receive data bits. At such time, driver C again enables the row 00 and simultaneously phase AH omites an enabling signal so that serial transfer through input section 210 does not occur. In other words, the normal serial transfer path is cut off and the parallel transfer path into parallel section 230 is enabled. Due to this interleaved mode of operation of input serial register 210, not only is synchronous operation of SPS register 200 provided, but also the input section 210 must be only eight-bits in length. This has obvious advantages for high density. By alternately transferring the data into the first, third, fifth and seventh storage sites of row 0 of central section 230, and then waiting to receive information bits in the second, fourth, sixth and eighth positions of that same row 0 before transmitting the 8 bits of data in parallel through the central section, high density is achieved. Also, the total number of transfers of a charge packet from input to output is reduced by such operation.

Not only is an encoding scheme, such as interleaving required at the input of the SPS register, but a decoding scheme is required at its output, since data bits may once again occupy only every other cell in the output section 220. The last row (row 34) of central section 230 acts to buffer the data as it leaves the central section. Phase B8c enables transfer of data out of central section 230, but in two steps. The information in the second, fourth, sixth and eighth sites is transferred through the gates (the fully implanted regions) directly into the output section 220. Phased signal trains A and B drive the shift register comprising output section 220 in two-phase push-clock operation and transfer the data out of output section 220. Phase driver A4c is timed such that when the first four bits of information transferred to the output section 220 have been serially propagated out of the output section, the other four bits of information (in the first, third, fifth and seventh sites of row 34 of the central section) are then transferred into the output section 220. In this manner, synchronous output operation is achieved. Charge packets are applied as an input from injector 100 to SPS register 200 and are transmitted as output to amplifier 300 at the rate of one MegaHz.

Referring once again to FIG. 3, parallel transfer of data bit in the form of packets of charge occurs through the central section 230 as follows. A packet of charge can be transferred from a first cell to a second, only if the second cell does not at the time of the attempted transfer already contain a charge packet; that is to say, the second cell must be empty (in a ready state) in order to receive charge. The objects of utilizing a multiphase SPS storage register is to achieve high density storage. The highest density possible is to have every storage site contain data. However, this is in conflict with the requirement of having a row ready for receiving data by being empty. Therefore, in order to get an operable storage register, at least one row must be empty. If there were only one empty row in central section 230, there would be a requirement for at least 32 different phase relationships for multiphase driving of the register. In the preferred embodiment, there are two empty rows. The second empty row is utilized so as to allow for relatively simplified multiphase clocking. As can be seen (once the system is initialized) the clock (drive) pulses used for driving the upper half of the register (rows 1 to 16) are identical to those used for driving the lower half of the register (rows 17-32). In this manner, only half as many phase relationships are required. This trade-off could be continued, doubling the number of empty rows while having the number of phase drives required. The end point of this trade-off is simple two-phase operation of the central section where two phases or merely two clocks are required, but at the cost of having every other row empty.

The relationships of the phase drivers are such that the data in each row is moved down one row for each period in which a new row of data is transferred into the first storage row (row 0) of the central section. To better understand this operation, assume data has just been transferred out of central section 230. Therefore, row 33 is empty and is ready to receive data. Accordingly, row 32 is pulsed (high) which transfers its data into row 33. Following this, row 31 is pulsed, transferring its data into row 32. This continues whereupon row 17 is pulsed to transfer its data into row 18. At this point, row 17 is empty. The transer of data (down) in this manner is equivalent to transferring the empty row (up) backward through the central section. At the same time as the empty row is transferred from row 17 to row 16, data is once again transferred out of row 33. In this manner, a new empty row is introduced into the central section. Another cycle of operation once again transfers the data from 32 to 33, from 31 to 32, etc., but it can be seen that at the same time data goes from row 15 to 16, 14 to 15, etc. and from row 0 into row 1. In other words, two parallel transferring operations occur simultaneously within the central section, transferring two empty rows (separated by 16 rows) upwards through the register. After the data in row 0 is transferred to row 1, new data is not immediately transferred into row 0. Control line C is enable twice, transferring 4 bits of data at a time from the input register 210 into row 0. Following this, row 0 is pulsed, and the data is transferred into row 1.

It should be emphasized that an empty row is distinct from a row carrying charge representative of a logical 0. An empty row contains no charge, and hence may receive either a zero (about $50 \times 10^{-15}$ Coulombs) or a one (about $230 \times 10^{-15}$ Coulombs). Accordingly, a logical 0 is sometimes referred to as a "fat zero". (For additional details concerning charge levels, refer to Related Application Nos. 3 and 4.)

The multiphase SPS structure offers high storage density and economical integration of clock drivers on a memory chip. The high density of the electrode-per-bit array combined with both the lower power consumption of the multiphase system and the elimination of external drivers, form the basis of an attractive memory system. Since the data stream is synchronous and clocks are (for the most part) internally generated, this system offers ease of use.

In the preferred embodiment, all transistors are MOSFET transistors. Accordingly, low signals enable the transistors and high signals turn the transistors off. In the diagrams, sizes for the transistors are given in terms of surface area of a semiconductor chip. The sizes are shown as width over length ($w/l$) in microns and are not in anyway meant to be restrictive as alternate geometries may be employed to the same effect.

The above description is included to illustrate the operation of the preferred embodiment and is not meant to limit the scope of the invention. The scope of the invention is to be limited only by the following claims. From the above discussion, many variations will be apparent to one skilled in the art that would yet be encompassed by the spirit and scope of the invention.

What is claimed is:

1. A charge-coupled device (CCD) shift register for storing bits of information in the form of packets of charge comprising:
 a plurality of driver circuits including:
  first and second driver circuits for generating a first and a second pulse train respectively, said first and second pulse trains being 180° out of phase, third and fourth driver circuits for generating a third and a fourth pulse train respectively, said third and fourth pulse trains being subsets of said first and said second pulse trains respectively, and other driver circuits for generating other pulses, a first set of said other pulses corresponding to said first pulse train and a second set of said other pulses corresponding to said second pulse train;

input means responsive to said third and said fourth pulse trains for serially transferring said packets of charge through said input means;

output means responsive to said first and said second pulse trains for serially transferring said packets of charge through said output means; and central storage means responsive to said other driver circuits for parallel transfer of a plurality of said packets of charge through said central storage means, said central storage means coupled to receive in parallel said plurality of said packets of charge from said input means and coupled to transmit in parallel said plurality of said packets of charge to said output means, said reception and said transmission each occurring in two steps.

2. The CCD register of claim 1 wherein said central storage means comprises n parallel columns of serial registers each of m bits in length, and wherein n packets of charge are transferred in parallel through said central storage means.

3. The CCD register of claim 2 wherein said reception and said transmission of said packets of charge and said central storage means is in two steps, each of n/2 packets of charge in parallel.

4. The CCD register of claim 3 wherein said transmission and reception steps correspond to $n/2$ packets of charge in the odd columns and $n/2$ packets of charge in the even columns respectively.

5. The CCD register of claim 1 wherein said central storage means comprises rows of storage sites, each of said rows coupled to one of said other driver circuits and wherein consecutive rows are coupled alternately to circuits which generate said first and said second sets of said other pulses respectively and wherein said plurality of said packets of charge are transferred in parallel from row to row.

6. The CCD register of claim 1 wherein said input means further comprises annihilator means coupled to the last site of said input means, said annihilator means preventing the build-up of residual charge in the sites comprising said input means.

7. The CCD register of claim 6 wherein said annihilator means comprises a diode-coupled MOS transistor.

8. The CCD register of claim 1 wherein said central storage means further includes:

input gating means responsive to a third of said driver circuits for providing a controlled path for the transfer of said plurality of said packets of charge from said input means to said central storage means; and output gating means responsive to a fourth of said driver circuits for providing a controlled path for the transfer of said plurality of said packets of charge from said central storage means to said output means.

9. The CCD register of claim 8 wherein said input means, said output means and central means are comprised of unidirectional storage sites, whereby said packets of charge may be transferred in only one direction through said storage sites.

10. The CCD register of claim 9 wherein each of said storage sites comprise a staggered oxide layer between the substrate and the respective electrode, whereby said unidirectionality is obtained.

11. The CCD register of claim 10 wherein each of said storage sites comprises an ion implanted region in the substrate below part of the respective electrode, whereby said unidirectionality is obtained.

12. The CCD register of claim 1 wherein the sites are conductivity connected by P++ diffusion regions between respective sites.

13. A CCD shift register for storing bits of information in the form of packets of charge comprising:

a first plurality of driver circuits including a first driver circuit for generating a first pulse train, a second driver circuit for generating a second pulse train, and other driver circuits for generating other pulses, said other pulses having a fixed relationship to said first pulse train; said second pulse train equalling said first pulse train except for one of said other pulses;

a second plurality of driver circuits including a third driver circuit for generating a third pulse train, a fourth driver circuit for generating a fourth pulse train, and remaining driver circuits for generating remaining pulses; said remaining pulses having a fixed relationship to said third pulse train, said fourth pulse train equalling said third train except for one of said remaining pulses, said third pulse train being 180° out of phase with respect to said first pulse train;

input means responsive to said second and said fourth driver circuits for enabling the serial transfer of said packets of charge through said input means, said input means containing $n$ storage sites and being capable of storing $n/2$ of said packets of charge at any one time, said packets of charge occupying at most every other of said $n$ storage sites;

output storge means responsive to said first and said third driver circuits for enabling the serial transfer of said packets of charge through said output means, said output means containing $n$ storage sites and being capable of storing $n/2$ of said packets of charge at any one time, said packets of charge occupying at most every other of said n storage sites; and central storage means responsive to said other and siad remaining driver circuits for enabling the parallel transfer of $n/2$ of said packets of charge through said central storage means, said central storage means coupled to receive said packets of charge from said input means $n/2$ at a time and coupled to transmit said packets of charge to said output means $n/2$ at a time.

14. The CCD register of claim 13 wherein said central storage means further includes:

input gating means responsive to one of said other pulses for providing a controlled path for the parallel transfer of said packets of charge from said input means to said central storage means; and output gating means responsive to one of said other circuits for providing a controlled path for the parallel transfer of said packets of charge from said central storage means to said output means.

15. The CCD register of claim 14 wherein said $n$ packets of charge are transferred to and from said central storage means in two steps, a first step wherein $n/2$ of said packets of charge are transferred with respect to even columns, and a second step wherein $n/2$ packets of charge are transferred with respect to odd columns.

16. The CCD register of claim 14 wherein said output gating means comprises a row of alternate gating and storage sites.

17. The CCD register of claim 13 wherein said input means further comprises annihilator means coupled to the last site of said input means, said annihilator means preventing the build-up of residual charge in the sites comprising said input means.

18. The CCD register of claim 13 wherein said annihilator means comprises a diode-coupled MOS transistor.

19. The CCD register of claim 13 wherein said central storage means is aligned in m rows and n columns, each of said $n$ columns comprising a serial register of length $m$, alternate of said $m$ rows responsive to one of said other pulses and one of said remaining pulses respectively.

20. The CCD register of claim 13 wherein the rows of said central storage means are coupled in parallel, and wherein each of said columns comprises m storage sites serially coupled.

21. The CCD register of claim 13 wherein said input means, said output means and said central means are comprised of unidirectional storage sites, whereby said packets of charge may be transferred in only one direction through said storage sites.

22. The CCD register of claim 13 wherein each of said storage sites comprise a staggered oxide layer between the substrate and the respective electrode, whereby said unidirectionality is obtained.

23. The CCD register of claim 13 wherein each of said storage sites comprises an ion implanted region in the substrate below part of the respective electrode, whereby said unidirectionality is obtained.

24. The CCD register of claim 13 wherein the sites are conductivity connected by P++ diffusion regions between respective sites.

* * * * *